US008670197B2

(12) United States Patent
Okumoto et al.

(10) Patent No.: US 8,670,197 B2
(45) Date of Patent: Mar. 11, 2014

(54) SUBSTRATE FOR DISPLAY DEVICE, METHOD FOR MANUFACTURING SAME, AND DISPLAY DEVICE

(75) Inventors: Yoshitaka Okumoto, Osaka (JP); Satoru Kishimoto, Osaka (JP); Kenji Takii, Osaka (JP); Naoko Inui, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 216 days.

(21) Appl. No.: 13/141,969

(22) PCT Filed: Oct. 9, 2009

(86) PCT No.: PCT/JP2009/067642
§ 371 (c)(1),
(2), (4) Date: Jul. 13, 2011

(87) PCT Pub. No.: WO2010/073798
PCT Pub. Date: Jul. 1, 2010

(65) Prior Publication Data
US 2011/0261477 A1   Oct. 27, 2011

(30) Foreign Application Priority Data

Dec. 26, 2008   (JP) .................................. 2008-332777

(51) Int. Cl.
*G02B 5/24* (2006.01)
*G02B 5/22* (2006.01)
(52) U.S. Cl.
USPC .......................... 359/886; 359/891; 359/892
(58) Field of Classification Search
USPC ........................................................ 359/886
See application file for complete search history.

(56) References Cited

U.S. PATENT DOCUMENTS

| 7,477,014 B2* | 1/2009 | Mitsuya .................. 313/504 |
| 2004/0009303 A1* | 1/2004 | Ito et al. ................ 427/421 |
| 2004/0115558 A1 | 6/2004 | Yang et al. |
| 2007/0075618 A1 | 4/2007 | Mitsuya |
| 2009/0191484 A1 | 7/2009 | Yang et al. |

FOREIGN PATENT DOCUMENTS

| JP | 3-89488 A | 4/1991 |
| JP | 2002-107528 A | 4/2002 |
| JP | 2004-55159 A | 2/2004 |

(Continued)

OTHER PUBLICATIONS

"Impregnate," the Free Merriam-Webster Dictionary, http://www.merriam-webster.com/dictionary/impregnate, Jul. 22, 2013.*

(Continued)

*Primary Examiner* — Jade R Chwasz
(74) *Attorney, Agent, or Firm* — Chen Yoshimura LLP

(57) ABSTRACT

Disclosed is a substrate for a display device, wherein generation of a region which is not filled with the components of a liquid material is suppressed by simple processes during the formation of color layers by a coating method such as an inkjet method using the liquid material, thereby achieving good display quality. Also disclosed are a method for manufacturing the substrate for a display device, and a display device. The substrate for a display device comprises, on a principal surface thereof, banks formed of a resin material, and color layers arranged in a plurality of pixel regions surrounded by the banks. The color layers are formed of the liquid material, and the bank is provided with an impregnated region containing the components of the liquid material.

12 Claims, 9 Drawing Sheets

(56) References Cited

FOREIGN PATENT DOCUMENTS

| | | |
|---|---|---|
| JP | 2004-126600 A | 4/2004 |
| JP | 2006-162881 A | 6/2006 |
| JP | 2006-162882 A | 6/2006 |
| JP | 2007-95614 A | 4/2007 |
| JP | 2008-268512 A | 11/2008 |

OTHER PUBLICATIONS

International Search Report (ISR) issued in PCT/JP2009/067642 (International application) mailed in Nov. 2009 for Examiner consideration.

* cited by examiner (a)

(b)

FIG. 3-2
(a)
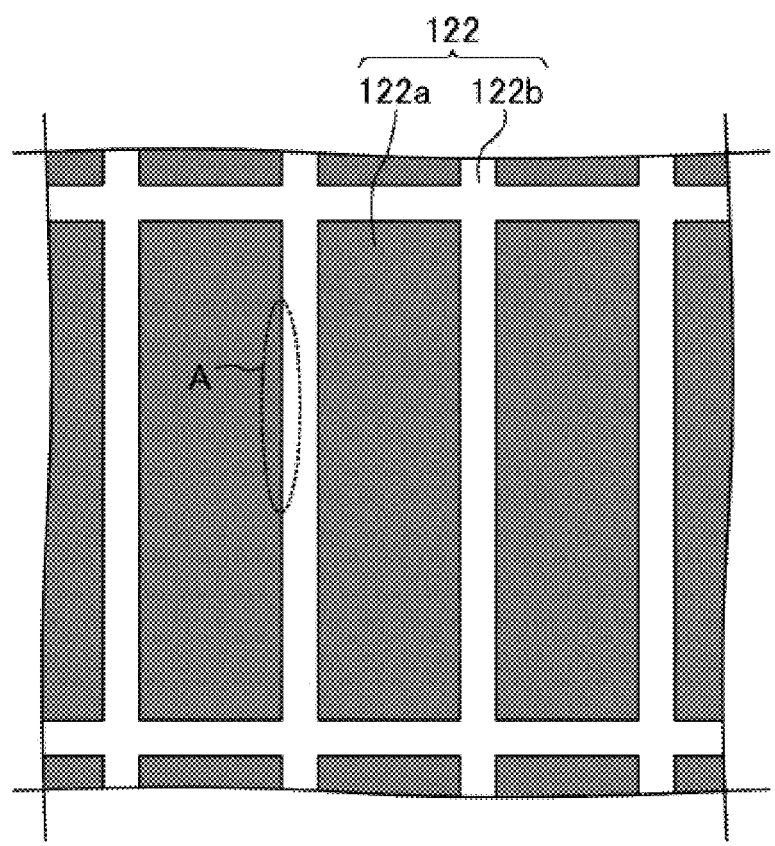
(b)
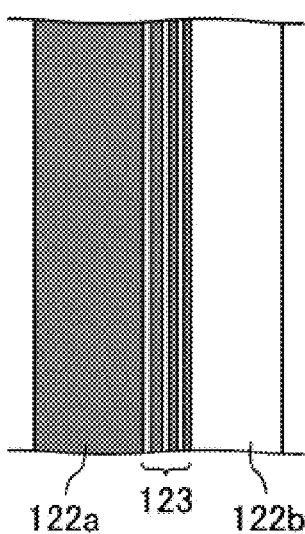
(c)
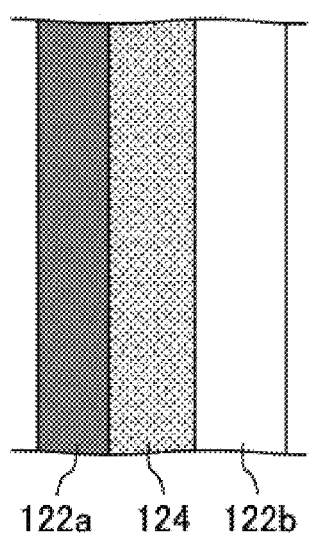

FIG. 4
(a)
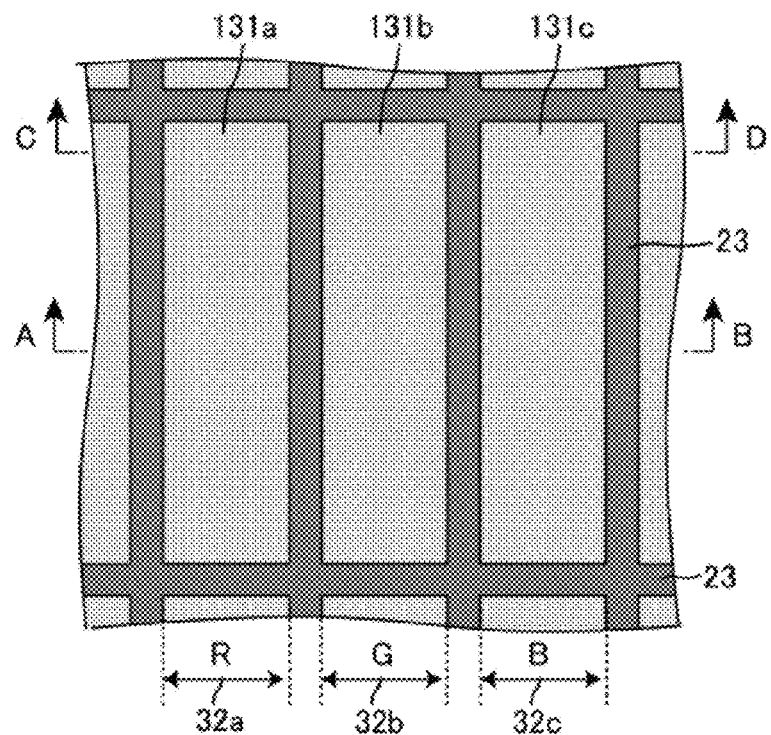
(b)
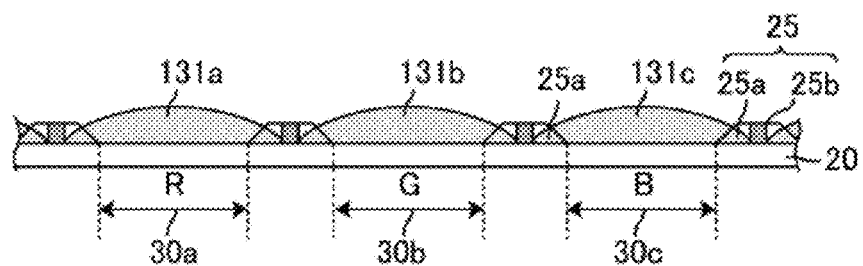
(c)
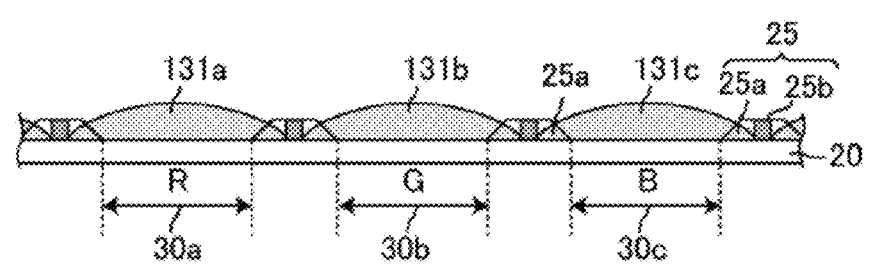

FIG. 8
(a)
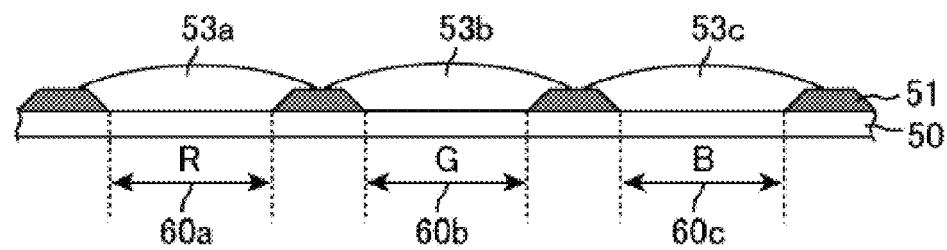
(b)
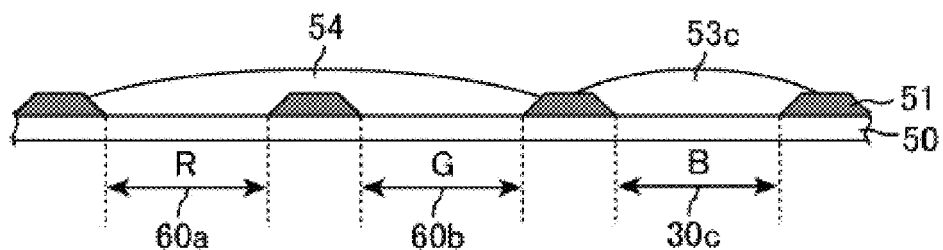

SUBSTRATE FOR DISPLAY DEVICE, METHOD FOR MANUFACTURING SAME, AND DISPLAY DEVICE

TECHNICAL FIELD

The present invention relates to a substrate for a display device, a method for manufacturing the same, and a display device. More specifically, it relates to a substrate for a display device, which is suited for a color filter substrate used for a color liquid crystal display device and a substrate used for an organic electroluminescence display device or the like, to a method for manufacturing the same, and to the display device.

BACKGROUND ART

In recent years, as the market for liquid crystal TVs expands, there has been an increasing demand for liquid crystal displays, especially for color liquid crystal displays. In order to further popularize the color liquid crystal displays in the future, lowering of the manufacturing cost is demanded, and a low-cost color filter (CF) substrate is especially sought after. In response to this, as a method of forming CFs (color layers) of a CF substrate, application of an inkjet method has been considered because the amount of the material used can be reduced.

One example of a method of forming a CF substrate by the inkjet method is described below with reference to FIG. 6. FIG. 6 is a cross-sectional schematic view showing an ink application to the substrate using an inkjet printing device.

In FIG. 6, a glass substrate 50 for forming CFs includes, on a principal surface thereof, dividing walls called banks 51 (walls for preventing color mixture) formed in a grid pattern, and a plurality of pixel regions are partitioned by the banks 51. Here, description will be made using an example of a pixel region 60a in which a red (R) CF is formed, a pixel region 60b in which a green (G) CF is formed, and a pixel region 60c in which a blue (B) CF is formed.

Preprocessing is performed on the glass substrate 50 arranged as described above in order for the banks 51 to have water repellency and for the openings of the pixel regions 60a to 60c to have hydrophilicity for separately painting different ink materials that are being applied.

The inkjet printing device 40 is equipped with nozzles 41a to 41c for applying (discharging) ink of the respective colors of red (R), green (G), and blue (B), and are disposed so as to face the pixel regions 60a to 60c. Then, once the ink of the respective colors of red (R), green (G), and blue (B) is discharged from the nozzles 41a to 41c, ink droplets 43a to 43c fall in the direction of the arrow A, and spread to the respective pixel regions 60a to 60c. By this, ink layers 53a to 53c are formed on the glass substrate 50, and the ink layers 53a to 53c are hardened by a baking treatment to become CFs. Formation of CFs by such a method has a merit of low costs because photolithography is not used.

However, CFs that were formed by the above-mentioned method could cause light leakage because the film thickness does not become even. This tendency is especially prominent in the rectangular pixel regions. The reason for this will be described with reference to FIG. 7. FIG. 7(a) is a schematic plan view of the pixel regions 60a to 60c, FIG. 7(b) is a schematic cross-sectional view along the line A-B of FIG. 7(a), and FIG. 7(c) is a schematic cross-sectional view along the line C-D of FIG. 7(a).

The ink layers 53a to 53c are made of a liquid material. Therefore, due to the effects of surface tension that the ink itself has, and due to the effects of being repelled by the banks 51 having water repellency, the film thickness becomes smaller near the banks 51, and the film thickness becomes larger near the center of the pixel regions 60a to 60c. Because of this, as shown in FIGS. 7(a) and 7(b), the ink layers 53a to 53c are able to secure sufficient film thickness and the ink is applied well near the center of the pixel regions 60a to 60c, but as shown in FIGS. 7(a) and 7(c), sufficient film thickness cannot be secured near the peripheral area of the pixel regions 60a to 60c, and regions 55 with no ink applied could be generated depending on circumstances. Due to this, color density became uneven in the pixel regions 60a to 60c, and display quality of a displayed image was sometimes lowered. Additionally, in FIG. 7(c), an outline arrow shows how light leakage occurs.

In order to suppress such light leakage, as shown in FIG. 8(a), increasing the amount of the ink droplets to run on the banks 51 can be considered. However, if the amount of the ink droplets is increased, as shown in FIG. 8(b), a mixed region 54 where ink droplets are mixed between the adjacent pixels could be generated, and color mixture could occur.

Here, in order to cover the regions where the film thickness becomes smaller within the rectangular pixel regions, there has been suggested a method of chamfering the bank shape in the corner area of a pixel region to prevent significant light leakage from the four corners of the rectangular pixels and the like (for example, see Patent Document 1). However, although light leakage can be reduced by this method, the pixel regions become smaller. Therefore, there was room for further improvement in order to increase the aperture ratio.

Further, there has been suggested a method of generating power to planarize the cross-sectional shape of the ink by forming grooves and holes, which are for letting ink out, in the banks in an organic electroluminescence (EL) display devices (for example, see Patent Document 2). However, processes for creating grooves and holes are required in this method, and therefore, the process becomes cumbersome. Furthermore, because the banks also function as light shielding portions, light that is supposed to be blocked passes through by forming grooves, holes and the like, and therefore, if this method is applied to a liquid crystal display panel, display quality could be lowered because of malfunctions due to light shielding failure of TFTs (Thin Film Transistors), light leakage from the regions other than the liquid crystal driving regions, reflection of outside light from a metal wire formed in a TFT substrate, and the like.

Moreover, there has been suggested a method of obtaining CFs with even film thickness by performing a planarizing process on a surface of the applied ink (for example, see Patent Document 3). However, in this method, the steps are cumbersome because the planarizing process is performed on a surface of CFs by applying pressure using a pressure roller or the like, scraping off the surface by a blade or the like, cutting off the surface by a cutter or the like. There is also a concern that the surface of the CF substrate may deteriorate.

Further, there has been suggested a method of specifying the contact angle of the banks and the ink material to prevent an ink material applied to pixel regions from going over the banks to mix with different colors (for example, see Patent Document 4). With this method, by adding water repellency and/or hydrophilicity to banks by a plasma treatment or the like, the contact angle of the banks and the ink material can be specified, and by this, color mixture can be prevented. However, there was room for improvement in terms of preventing color mixture more easily.

RELATED ART DOCUMENTS

Patent Documents

Patent Document 1: Japanese Patent Application Laid-Open Publication No. 2006-162881
Patent Document 2: Japanese Patent Application Laid-Open Publication No. 2007-95614
Patent Document 3: Japanese Patent Application Laid-Open Publication No. 2002-107528
Patent Document 4: Japanese Patent Application Laid-Open Publication No. 2006-162882

SUMMARY OF THE INVENTION

Problems to be Solved by the Invention

The present invention is provided in light of the above-mentioned current situation, and an object of the invention is to provide a substrate for a display device, a method for manufacturing the same, and a display device, wherein generation of a region which is not filled with a liquid material is suppressed by simple processes during the formation of color layers by a coating method such as an inkjet method using the liquid material, thereby achieving good display quality.

Means for Solving the Problems

The present inventors have studied various display device substrates and manufacturing methods thereof that can suppress generation of a region which is not filled with a liquid material during formation of color films by a coating method such as an inkjet method. They first focused on the structure of a bank formed of a resin material. The present inventors found that when the cure degree of the banks during application of the liquid material is controlled to the degree that they can contain the liquid material so that the banks become impregnated with the liquid material when the liquid material is applied to the substrate, the liquid material is likely to stay within the pixel regions, and at the same time, it is possible to also resolve the problem of generation of a non-filled region, which is caused by the liquid material being repelled at a surface of the banks, and to planarize the liquid material. Therefore, the inventors have discovered good display quality can be achieved when this scheme is applied to a display device, and have come to realization that the above-mentioned problem can be solved, thereby arriving at the present invention.

That is, the present invention is a substrate for a display device that includes, on a principal surface thereof, banks formed of a resin material, and color layers arranged in a plurality of pixel regions surrounded by the above-mentioned banks, wherein the above-mentioned color layers are formed of a liquid material, and the above-mentioned bank includes an impregnated region containing components of the above-mentioned liquid material.

The present invention is also a method for manufacturing a substrate for a display device that includes, on a principal surface of the substrate, banks formed of a resin material, and color layers formed of the liquid material arranged in a plurality of the pixel regions surrounded by the above-mentioned banks, the method including: a bank formation step in which the above-mentioned banks are formed, and a color layer formation step in which the above-mentioned color layers are formed, wherein the above-mentioned bank formation step includes an exposure step in which exposure is performed on the above-mentioned resin material pattern-formed on the principal surface of the above-mentioned substrate, and in the above-mentioned exposure step, the exposure is performed such that a region having a cure degree lower than a resin material of other areas is formed on the resin material of an area to be in contact with the above-mentioned color layers, and wherein the above-mentioned color layer formation step includes a coating step in which the above-mentioned liquid material is applied, and the resin material with the lower cure degree, which was formed in the above-mentioned exposure step, becomes impregnated with the liquid material; and a baking step in which the above-mentioned liquid material is baked to form the above-mentioned color layers after the above-mentioned coating step.

Further, the present invention is also a display device that includes; the substrate for a display device of the present invention described above, or a substrate for a display device manufactured by the method for manufacturing the substrate for a display device of the present invention described above.

The present invention will be described in detail as follows.

In the present invention, there are no special limitations for the substrate on which the banks are formed, and a substrate that is commonly used as a substrate for a display device such as a glass substrate, a resin substrate or the like can be applied. The banks formed on a principal surface of the substrate are made of a resin material, but there are no special limitations for this resin material, and a resin material commonly used can be used. The banks are formed on the principal surface of the substrate so as to partition a plurality of the pixel regions.

A liquid material is applied to a plurality of the pixel regions surrounded by the banks to form color layers. Here, a bank of the present invention needs to include an impregnated region containing components of the above-mentioned liquid material. The impregnated region is formed by not only the liquid material being disposed in the central area of the pixel regions, but also by the liquid material reaching the banks, and by the components soaking into the banks. In the past, the liquid material was elevated in the central area of the pixel region because it is repelled by lyophobic banks, and the film thickness became smaller in the peripheral area of the pixel region, and therefore, a region which is not filled with the liquid material was often generated near the banks.

On the other hand, in the present invention, a liquid material soaks into the banks, creating an impregnated region, and therefore, the liquid material flows toward the bank side from the central area of the pixel region, which makes it difficult for the region in which no liquid material is applied to be generated within the pixel region, thereby improving light leakages. Further, with respect to the liquid material upon application (immediately after it is applied), the permeation amount of the liquid material in the banks becomes larger in the area of a large film thickness than in the area of a small film thickness, and therefore, even though the permeation amount of the liquid material in the banks is not particularly controlled, the film thickness of the liquid material can be made uniform. Furthermore, because the film thickness of the liquid material becomes uniform, the liquid material is not likely to go over the banks to enter the adjacent pixel regions, and if the liquid material is an ink material for forming color filters, for example, it is possible to suppress the occurrence of color mixture in which ink droplets get mixed between the adjacent pixels.

A preferred example of the above-mentioned bank is a bank that does not have the above-mentioned impregnated region formed in the central area between the above-mentioned pixel regions that are adjacent to each other. The central area between the adjacent pixel regions means the area not in contact with the pixel regions on both sides. Moreover, when narrow banks and wide banks coexist on a substrate, it is preferable that the above-mentioned impregnated region be not formed in the central area between the pixel regions of the narrow banks. Also, when the shape of the pixel regions is rectangular, it is preferable that the above-mentioned impregnated region be not formed in the central area between the pixel regions on the long side. According to this configuration, it is possible to prevent the liquid material soaked in the bank from reaching the adjacent pixel regions, and to suppress the occurrence of color mixture effectively.

Further, another preferred example of the bank is a bank that includes the above-mentioned impregnated region in the area that is in contact with the corners of the above-mentioned pixel regions. Having the impregnated region formed in the corners of the pixel regions means that the liquid material is sufficiently filled to the corners of the pixel regions. As a result, light leakage can be prevented.

Moreover, another preferred configuration of the bank is a bank that does not have the above-mentioned impregnated region formed in the central area between the above-mentioned pixel regions that are adjacent to each other, and includes the above-mentioned impregnated region in the area that is in contact with the corners of the above-mentioned pixel regions. With this configuration, color mixture and light leakage can be suppressed.

It is preferable that the banks described above be entirely formed of a light-shielding material. Then, the bank can be used as a light-shielding member (a black matrix) that separates the color layers each constituting a pixel of a different color.

The above-mentioned color layers only need to contribute to color display of a display device, and they are not limited to layers that have been colored. Layers that are formed of a colored transparent resin can preferably be used as CF layers of a CF substrate of a liquid crystal display device, for example. In a CF substrate including the configuration of the display device substrate of the present invention, light leakage can be prevented by filling the liquid material to the corners of the respective pixel regions. Furthermore, the above-mentioned colored layers may be EL layers. As the EL layers, organic layers such as light-emitting layers, hole transport layers or the like in an organic EL display device can be used, for example.

In terms of a structure of the substrate for a display device of the present invention, a structure that includes the above-described characteristics can be used, and there is no special limitation for the other structures. If the substrate for a display device of the present invention is a CF substrate, it has the structure of a substrate in which color layers with three colors of red, green and blue, and banks that separate the respective color layers are formed in respective pixels on the substrate, and a protective film, an opposite electrode, an alignment film and the like are laminated and disposed on an upper layer thereof, for example.

Moreover, a method for manufacturing the substrate for a display device of the present invention includes a bank formation step in which banks made of a resin material are formed on a principal surface of the substrate, and a color layer formation step in which color layers made of a liquid material are formed in a plurality of pixel regions surrounded by the banks.

The above-mentioned bank formation step includes an exposure step in which exposure is performed on a resin material pattern-formed on a principal surface of the substrate. In this exposure step, exposure is performed so that a region with lower cure degree than a resin material of other areas is formed in a resin material of the area in contact with the above-mentioned color layers. Such exposure can be performed by using a mask that has openings in desired areas, for example, and therefore, the present invention can be realized by a simple method.

The above-mentioned color layer formation step includes a coating step in which the above-mentioned liquid material is applied, and the resin material with low cure degree, which was formed in the above-mentioned exposure step, is impregnated with the liquid material; and a baking step in which the above-mentioned color layers are formed by baking the above-mentioned liquid material after the above-mentioned coating step. It is preferable that the above-mentioned coating step be performed by dripping the liquid material to the banks by a coating method such as an inkjet method or the like.

A preferred embodiment of the present invention is that the above-mentioned baking step includes performing polymerization of the above-mentioned resin material along with the baking of the above-mentioned liquid material. According to this step, because polymerization of the resin material and baking of the liquid material can be performed at once, the manufacturing steps can be simplified.

Further, a preferred embodiment of the present invention is that, in the above-mentioned exposure step, between the pixel regions that are adjacent to each other described above, exposure is performed on the above-mentioned resin material such that the cure degree of the central area between the above-mentioned pixel regions becomes higher than the cure degree of the peripheral area. Such exposure can be achieved easily by using a mask in which only the central areas between the adjacent pixel regions are opened, for example.

Further, a preferred embodiment of the present invention is that, in the above-mentioned exposure step, exposure is performed such that a cure degree of the region in contact with the corners of the above-mentioned pixel regions becomes lower than a cure degree of the other regions. Such exposure can easily be achieved by using a mask that covers the regions in contact with the corners of the pixel regions. Furthermore, between the above-mentioned pixel regions that are adjacent to each other as described above, exposure may also be performed such that the cure degree of the central area between the above-mentioned pixel regions becomes higher than the cure degree of the peripheral areas, and the cure degree of the regions in contact with the corners of the above-mentioned pixel regions becomes lower than the cure degree of the other regions.

As an embodiment of a method for manufacturing the substrate for a display device of the present invention, as long as these elements are included, it is not particularly limited by the existence or non-existence of other steps.

There is no special limitation for a display device of the present invention as long as it includes the above-mentioned substrate for a display device of the present invention, or as long as it includes a substrate for a display device that was manufactured by the above-mentioned manufacturing method. Preferably it is a liquid crystal display device or an organic EL display device, for example. If the display device is a liquid crystal display device, by using a coating method such as an inkjet method for forming color layers, it is possible to achieve a liquid crystal display device with high display quality in which light leakage from the peripheral area of the pixels is prevented. Moreover, if the display device is an organic EL display device, by using the coating method such as the inkjet method for forming organic layers such as light-emitting layers, it is possible to achieve an organic EL display device with high display quality in which uneven brightness in the peripheral area of the pixels is prevented.

Effects of the Invention

In the substrate for a display device of the present invention, a method for manufacturing the same, and a display device, by having the impregnated region including the components of a liquid material in the bank, color mixture can be prevented by simple processes during the formation of the color layers by the coating method such as the inkjet method or the like, and light leakage can also be prevented by suppressing generation of a region which is not filled with the liquid material in the pixel regions, and therefore, a display device with good display quality can be achieved.

BRIEF DESCRIPTION OF THE DRAWINGS

FIG. 3-1(a) is a schematic plan view showing the configuration of a mask used in the second exposure step of Embodiment 1 of the present invention, and 3-1(b) is a schematic plan view showing another example of the mask.

FIG. 3-2(a) is a schematic plan view showing the configuration of a mask pattern, and FIGS. 3-2(b) and 3-2(c) are magnified schematic plan views of the regions shown with the dashed line A in FIG. 3-2(a).

FIG. 4(a) is a schematic plan view showing the configuration of a pixel of the CF substrate of Embodiment 1, FIG. 4(b) is a schematic cross-sectional view along the line A-B of the CF substrate shown in FIG. 4(a), and FIG. 4(c) is a schematic cross-sectional view along the line C-D of the CF substrate shown in FIG. 4(a).

FIG. 8(a) is a schematic cross-sectional view of a CF substrate showing pixels in which no color mixture is generated, and FIG. 8(b) is a schematic cross-sectional view showing pixels in which color mixture is generated.

DETAILED DESCRIPTION OF EMBODIMENTS

The present invention will be explained in more detail by providing embodiments as follows, but the present invention is not limited to these embodiments only.

Embodiment 1

With reference to FIG. 1 to FIG. 4, explanation of the present embodiment will be made by providing an example in which, the substrate for a display device is a CF substrate, a film-type photosensitive/light-shielding resin is used as a resin material for forming banks, and CFs as color layers are formed by an inkjet method using an ink material that is a liquid material.

Figure 1:
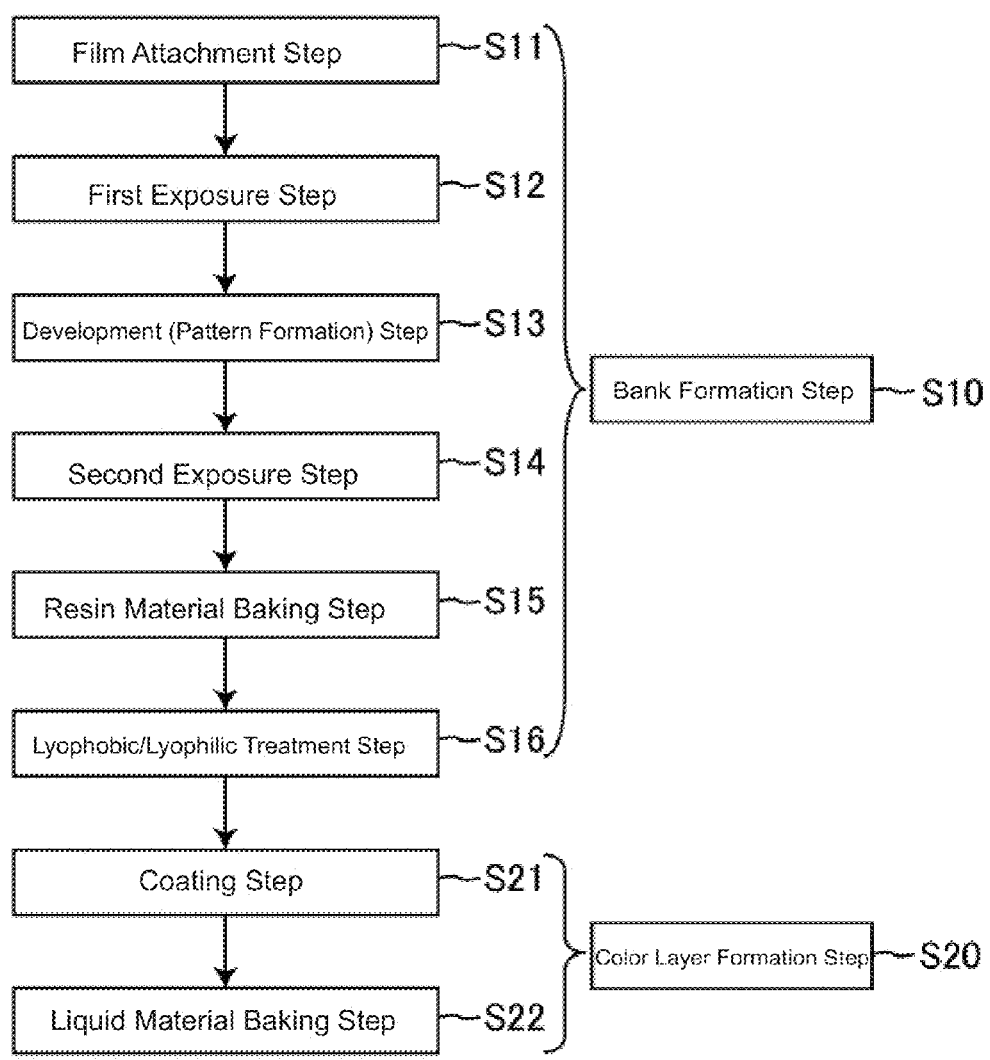
FIG. 1 is a flow chart showing steps for manufacturing the CF substrate of Embodiment 1 of the present invention.
Figure 2:
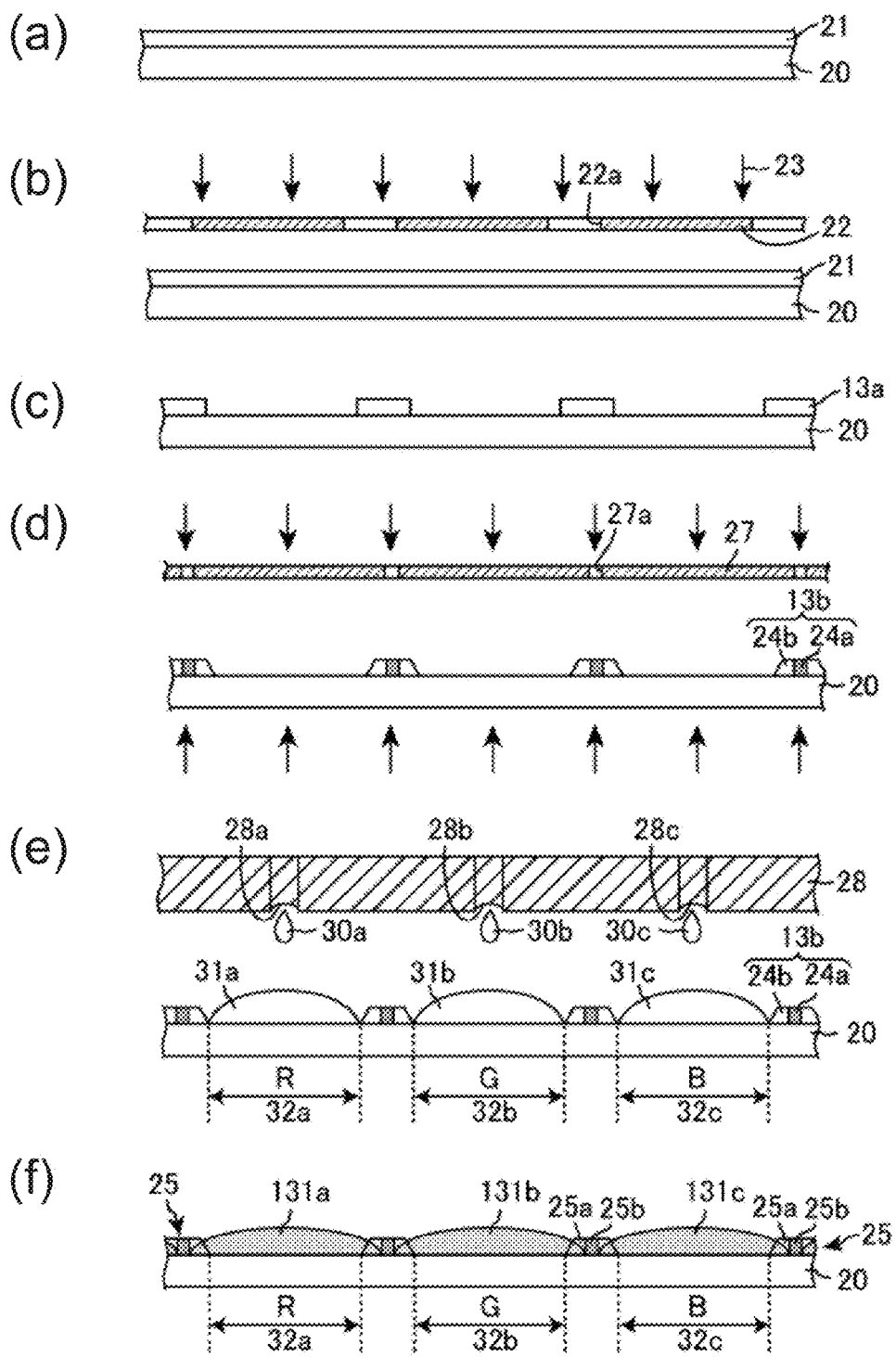
FIGS. 2(a) to 2(f) are schematic cross-sectional views showing steps for manufacturing the CF substrate of Embodiment 1 of the present invention.

FIG. 1 is a flow chart view showing steps for manufacturing the CF substrate of the present embodiment, and FIG. 2 is a schematic cross-sectional view showing steps for manufacturing the CF substrate of the present embodiment. In FIG. 1, a bank formation step (step S10) for forming banks is made of a film attachment step (step S11) through a lyophobic/lyophilic treatment step (step S16), and a color layer formation step (step S20) for forming color layers is made of a liquid material coating step (step S21) and a liquid material baking step (step S22).

In the bank formation step (S10), the film attachment step (S11) is performed first. In the film attachment step (S11), on a principal surface of the glass substrate, a resin film that will be the material of the banks is attached. Before this film attachment, on the principal surface of the glass substrate, a silane coupling agent for improving the adhesion of the film is applied, and a baking treatment is performed. It is preferable that the baking treatment be performed at approximate temperature of 140 to 160° C.

Next, a laminate treatment is performed while heating the resin film made of a photosensitive/light-shielding resin. An ultraviolet (UV) curable, thermosetting, and light-shielding resin film is preferably used as the resin film. The film thickness of the resin film is set such that color mixture with the adjacent pixels does not occur in the color layer formation step (S20) described later, and that it is not significantly thicker than the film thickness of the finished color layers. For example, when the film thickness of the finished color layers is approximately 2 μm, the resin film will have the approximate film thickness of 1.5 to 2.5 μm. Moreover, it is preferable that the laminate treatment be performed at approximately 80 to 160° C. By the laminate treatment, as shown in FIG. 2(a), a resin layer 21 is formed on the principal surface of the glass substrate 20.

Next, a first exposure step (S12) will be performed. In this step, as shown in FIG. 2(b), a first mask 22 in which openings 22a that correspond to a desired bank pattern are formed is disposed over the resin layer 21, and UV light 23 is radiated through this first mask 22. The UV irradiation in this step is performed such that the resin layer 21 does not get completely hardened. This is because, in the color layer formation step (S20) that will be described later, an impregnated region will be formed by impregnating the resin of the desired regions with an ink material. The cure degree of the resin material in the first exposure step (S12) is appropriately set depending on a material/combination of the resin material and the ink material, the shape of the pixel regions and the like, but the cure degree that can maintain the shape as a bank is used. As for the UV irradiation, UV irradiation in which the UV light 23 including light with the wavelength of 365 nm is radiated on the resin layer 21 with the intensity of 50 to 200 mJ/cm$^2$ (detection wavelength: 365 nm) can be used, for example.

Next, development (pattern formation) step (S13) is performed. By the development, as shown in FIG. 2(c), banks 13a in the desired pattern are formed on the principal surface of the glass substrate 20.

Next, a second exposure step (S14) is performed. In this step, in order to form the impregnated regions of the ink material in the banks 13a, as shown in FIG. 2(d), a second mask 27 in which openings 27a are formed in a desired pattern is disposed over the principal surface of the glass substrate 20 on which the banks 13a are formed, and then the UV light is radiated (post exposure) from both sides, which are the upper side of the second mask 27 and the rear surface side of the glass substrate 20. As a result, the banks 13a become banks 13b that include the regions with high cure degree 24a and the regions with low cure degree 24b. Here, the cure degree of the regions with high cure degree 24a means the cure degree in which the regions are not substantially interpenetrated by the ink material applied in the color layer formation step (S20) described later, and the cure degree of the regions with low cure degree 24b means the cure degree in which the ink material can be impregnated.

Figure 3:
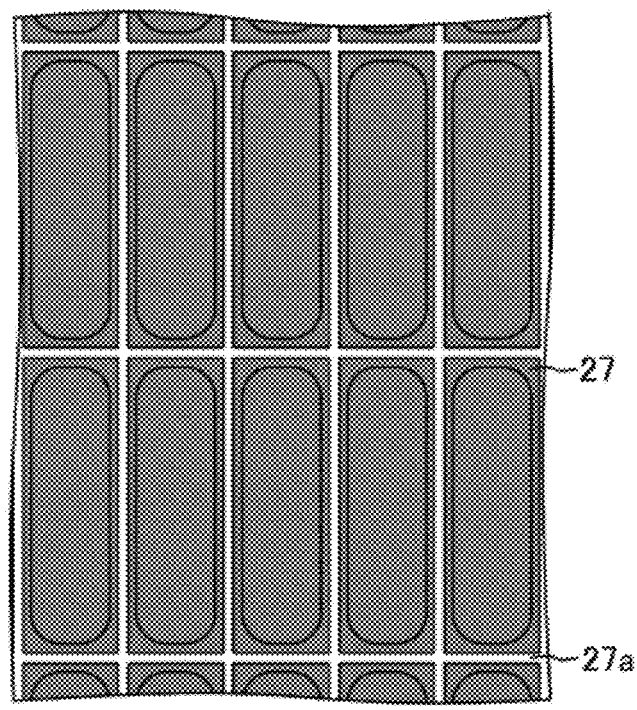
Figure 1:
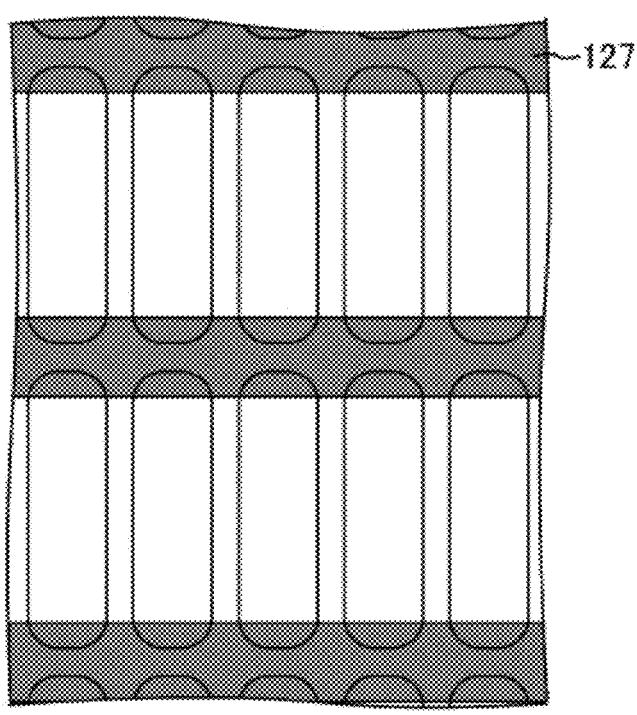

As for the second mask 27, as shown in FIG. 3-1(a), the second mask 27 including a mask pattern in which the openings 27a are formed in the central area between the pixel regions that are adjacent to each other is used. Furthermore, in the second exposure step (S14), a mask with a desired mask pattern may also be disposed over the rear surface side of the glass substrate 20 as necessary.

Next, a resin material baking step (S15) is performed. In the baking treatment, considering the shape of the banks 13b changes due to heat contraction during baking, temperature is adjusted so that the taper angle of the banks 13b become a desired value. Additionally, the cure degree of the abovementioned resin material is mainly determined by the UV irradiation performed in the second exposure step (S14), but it is also determined by the baking temperature in the resin material baking step (S15), and therefore, the condition of the UV irradiation, the baking temperature, and the like are determined considering blending of the resin material with the ink material and the like.

By performing the baking treatment described above, not only the resin material can maintain the pattern shape steadily, but also it is possible to prevent elution of the resin material that could otherwise occur after the display panel is formed, as the polymerization progresses. Moreover, by performing the UV irradiation and the baking treatment in the second exposure step (S14) and the resin material baking step (S15), it is possible to also obtain an effect that the banks 13b are unlikely to be peeled off of the glass substrate 20.

Next, the lyophobic/lyophilic treatment step (S16) is performed. In this step, in order to separately paint the ink material, which will be applied to the pixel regions, a preprocessing is performed such that the opening region of the pixels, that is the principal surface of the glass substrate 20, becomes lyophilic, and the banks 13a become lyophobic. As such a preprocessing, processes such as ashing by an oxygen plasma process and the like to add lyophilicity, and a fluorine plasma process, such as a $CF_4$ plasma process and the like, to add a lyophobicity can be used, for example.

Here, in the present invention, it is preferable that a lyophobic characteristic be added to the banks 13a in order to prevent color mixture. This is to prevent color mixture caused when the applied ink material goes over the upper part of the banks 13a and mixes with the ink material of the adjacent pixel regions. Meanwhile, the impregnated regions need to be formed in the banks 13a by impregnating the banks with the ink material. Therefore, the fluorine plasma process may be performed such that a lyophobic characteristic is especially present in the upper part of the banks 13a, and the side surfaces of the banks 13a may be processed in accordance with locations where the impregnated regions are formed, for example. Furthermore, as the structure of the banks that easily makes a lyophobic characteristic present only in the upper part side of the banks by the fluorine plasma process, a structure in which the cross-sectional shape in the width direction has a tapered surface (side surface) of a reversed tapered shape can be used.

The fluorine plasma process can be performed using a dry-etching device of a vacuum pumping system, an atmospheric-pressure plasma device, or the like. When performing the plasma process using the dry-etching device of a vacuum pumping system, it is preferable that the process condition be $CF_4/O_2$=(240 sccm to 300 sccm)/(0 sccm to 60 sccm), the process time of 20 sec to 100 sec, and 25° C. (processing at room temperature). When performing the plasma process using the atmospheric-pressure plasma device, a direct-type plasma device is preferable, and the process condition of $CF_4/N_2$=(15 slm to 20 slm)/(65 to 75 slm), 3.0 KVA to 3.6 KVA, the transfer velocity of 0.5 to 3 m/min, and the temperature of 25° C. to 35° C. is preferable. Other than $CF_4$, fluorine-containing gas, such as $SF_6$, $CHF_3$, $C_2F_6$ and the like, may be used as the gas used for the fluorine plasma process, and the fluorine-containing gas may contain an $O_2$ gas, an inert gas, such as He, $N_2$ and the like.

After the bank formation step (S10) is performed as described above, the color layer formation step (S20) will then be performed. In the color layer formation step (S20), the coating step (S21) to apply the ink material is performed first. In the coating step (S21), as shown in FIG. 2(e), the ink material is applied using an inkjet printing device 28. The ink material is a liquid material in which a pigment, a dye, or the like for expressing a desired color is dissolved and dispersed in a solvent. There is no special limitation for the composition of the ink material, but, here, explanation will be made using an example of the ink of each color of red (R), green (G), and blue (B), which was created by dissolving a high molecular material in a solvent to be made into an ink. The inkjet printing device 28 is equipped with nozzles 28a to 28c that discharge the ink of each color, and the nozzles 28a to 28c are disposed so as to face prescribed pixel regions 32a to 32c.

When the ink material of each color of red (R), green (G), and blue (B) is discharged from the nozzles 28a to 28c, droplets 30a to 30c of the ink material fall in the direction of an arrow A. Because a surface treatment has been performed on the glass substrate 20 in the above-mentioned lyophobic/lyophilic treatment step (S16), the droplets 30a to 30c of the ink material are stored in the pixel regions 32a to 32c by a self-patterning phenomenon, and become ink layers 31a to 31c.

Here, in the present embodiment, because the regions with low cure degree 24b are formed in the banks 13b in the above-mentioned second exposure step (S14), a part of the ink material that has spread in the pixel regions 32a to 32c soaks into the regions with low cure degree 24b. In the present embodiment, the entire inner peripheral area of the banks 13b that surrounds the pixel regions 32a to 32c is the region with low cure degree 24b, and therefore, the spherical ink material, which is elevated in the central area of the pixel regions 32a to 32c due to the effect of its own surface tension when dropped, soaks into the banks 13b from the parts that touched the banks 13b, and the ink material flows toward the bank 13b sides from the central area. As a result, the ink material spreads in the pixel regions 32a to 32c evenly.

Further, because the regions with high cure degree 24a where the ink material is not impregnated with are formed in the banks 13b, it is possible to prevent the ink material with which the banks 13b are impregnated from mixing with the adjacent ink materials. Furthermore, because a strong lyophobic characteristic has been added to the upper surface of the banks 13b in the lyophobic/lyophilic treatment step (S16), it is possible to prevent the ink material from going over the banks 13b and mixing with the adjacent inks.

Next, the liquid material baking step (S22) for baking the ink material is performed. In the liquid material baking step (S22), by a baking treatment, as shown in FIG. 2(f), the ink layers 31a to 31c become hardened and CF layers 131a to 131c are formed, and at the same time, the ink material soaked in the banks 13b is hardened as well. The banks 25 that underwent hardening include the inclusion regions 25a that are impregnated with the ink material and the regions 25b that are not impregnated with the ink material. The inclusion regions 25a include a high molecular material (a pigment) of the ink material, and do not include the solvent of the ink material because it has been volatilized during baking. Additionally, only the components of a single color, which is any one of red, green or blue, is included in the inclusion region 25a of the respective banks 25. This can be verified by an elemental analysis using a Time-Of-Flight Secondary Ion Mass Spectrometry (TOF-SIMS), or the like, for example.

After the color layer formation step (S20), a common electrode (ITO) and the like are formed, and the CF substrate is completed. The arrangement of the obtained CF substrate is shown in FIG. 4. FIG. 4(a) is a schematic plan view of the pixel regions 32a to 32c, FIG. 4(b) is a schematic cross-sectional view along the line A-B of FIG. 4(a), and FIG. 4(c) is a schematic cross-sectional view along the line C-D of FIG. 4(a). As shown in FIG. 4(a), the ink material is filled to the corners of the respective pixel regions 32a to 32c, and the regions in which no ink material is filled now disappear. Thus, it is possible to obtain the CF substrate with high display quality in which light leakage from the four corners of the pixel regions 32a to 32c is suppressed.

Furthermore, because the ink material soaks into the banks 25, the film thickness of the CF layers 131a to 131c near the inclusion regions 25a becomes larger, making the overall shape planarized. Moreover, because the ink material spreads evenly in the pixel regions 32a to 32c, the film thickness of the CF layers 131a to 131c can become even, and as shown in FIG. 4(b) and FIG. 4(c), the cross-sectional shape of the CF layers 131a to 131c can be planarized. Further, when the width of the banks 25 is smaller than the distance that the ink material infiltrates, there is a concern that the ink material may seep to the aperture regions of the adjacent pixels to cause color mixture. But in the present embodiment, as shown in FIG. 4(b) and FIG. 4(c), the regions 25b that are not impregnated with the ink material are formed in the banks 25, and therefore, it is possible to prevent color mixture between the adjacent pixels caused by the infiltration of the ink material.

Additionally, because the amount of the light-shielding material included in the banks 25 does not change even the ink material soaks into the banks, the light-shielding effect will not be lowered. Moreover, if the resin material forming the banks 25 remains not polymerized, there is a concern that the resin material may elute after the panel is formed. But because it is possible to polymerize the resin material as well in the step of the liquid material baking step (S22), the elution of the resin material can be prevented.

As described above, by using photo-polymerization and thermal-polymerization concurrently while controlling the exposure condition, the baking condition, and the like, it is possible to form the banks 25 that have the inclusion regions 25a that are impregnated with the ink material and the regions 25b that are not impregnated with the ink material. As a result, the ink material can be evenly applied to the pixel regions, and it is possible to create a CF substrate with high color purities in which light leakage is suppressed.

Furthermore, in the above-mentioned description, explanation was made by providing an example of the resin material, which can be hardened by both light and heat, as the material forming the banks 25. However, the present invention is not limited to this. It is preferable to use the material having both characteristics of the UV curability and the thermal curability, but the material with either one of the characteristics may also be used. Further, in the above-mentioned description, an example in which a resin film is used as the material for the banks was provided, but the present invention is not limited to this. A liquid resin material can also be applied. If a liquid resin material is used, it is applied to the glass substrate 20 by a spin coating, die-coating, or nozzle coating, for example. Alternatively, it is also possible to apply the liquid resin material to the substrate by an inkjet method or the like to form a pattern thereof. In this case, the exposure and the development steps in the steps S12 and S13 can be eliminated.

It is also possible not to perform the resin material baking step (S15), and to perform the baking of the resin material in the liquid material baking step (S22). In this case, the number of the steps can be reduced.

Furthermore, in the above-mentioned description, the second mask 27 with a mask pattern shown in FIG. 3-1(a) was used in the second exposure step (S14), but the present invention is not limited to this. As shown in FIG. 3-1(b), a mask 127 with a mask pattern in which the impregnated regions are formed in the area in contact with the corners of the pixel regions may be used as well. In this case, the ink material can be applied to the corners of the pixel regions where light leakage is likely to occur. Furthermore, exposure may also be performed using a mask with a mask pattern such that the cure degree of the central area between the pixel regions becomes higher than the cure degree of the peripheral area, and the cure degree of the regions in contact with the corners of the pixel regions becomes lower than the cure degree of other regions.

Moreover, in the above-mentioned description, the CFs in the color filter substrate of a liquid crystal display device were provided as an example of color layers, but the present invention is not limited to this, and organic layers such as light-emitting layers, hole transport layers, or the like of an organic EL display device may be used as the color layers, for example. Further, the ink material was provided as an example of the liquid material, but the present invention is not limited to this, and any liquid material that can be dried and solidified to form a color layer may be used.

Moreover, in the above-mentioned description, explanation was made by providing an example in which the banks 13a undergo the lyophobic/lyophilic treatment step (S16) in order to separately paint the ink material, but the present invention is not limited to this, and the lyophobic/lyophilic treatment may be performed as necessary. For example, when using banks that have water repellency in which color mixture is not a concern, it is not necessary to perform the above-mentioned plasma process or the like.

Embodiment 2

Figure 5:
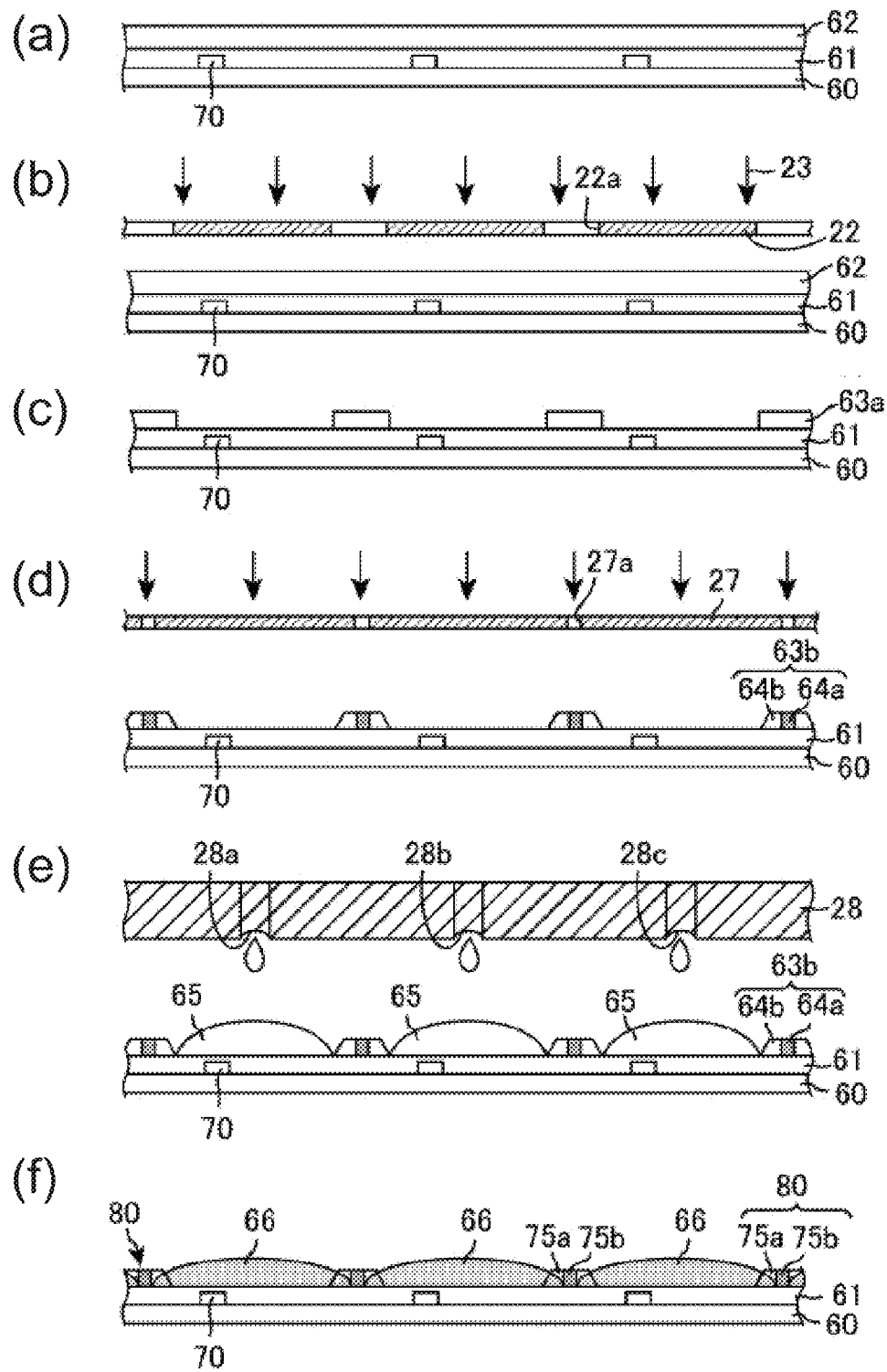
FIGS. 5(a) to 5(f) are schematic cross-sectional views showing steps for manufacturing the organic EL substrate of Embodiment 2 of the present invention.
Figure 6:
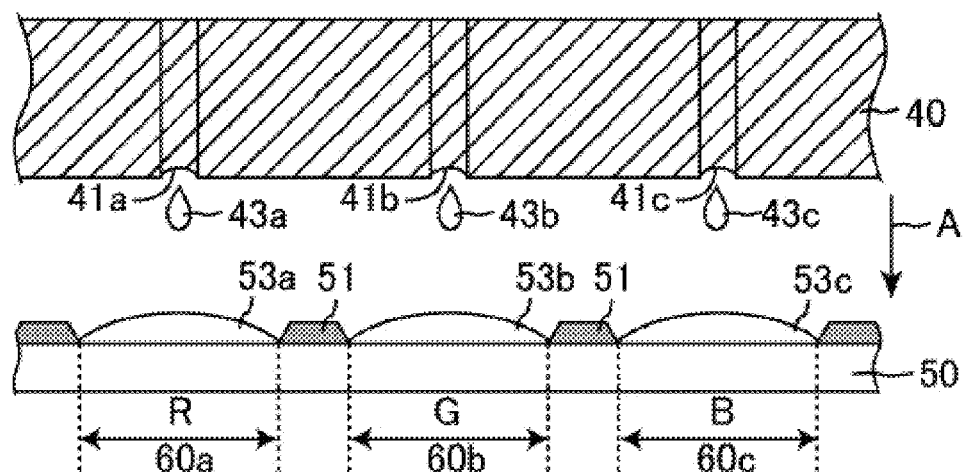
FIG. 6 is a schematic cross-sectional view showing a conventional method for manufacturing a CF substrate by an inkjet method.
Figure 7:
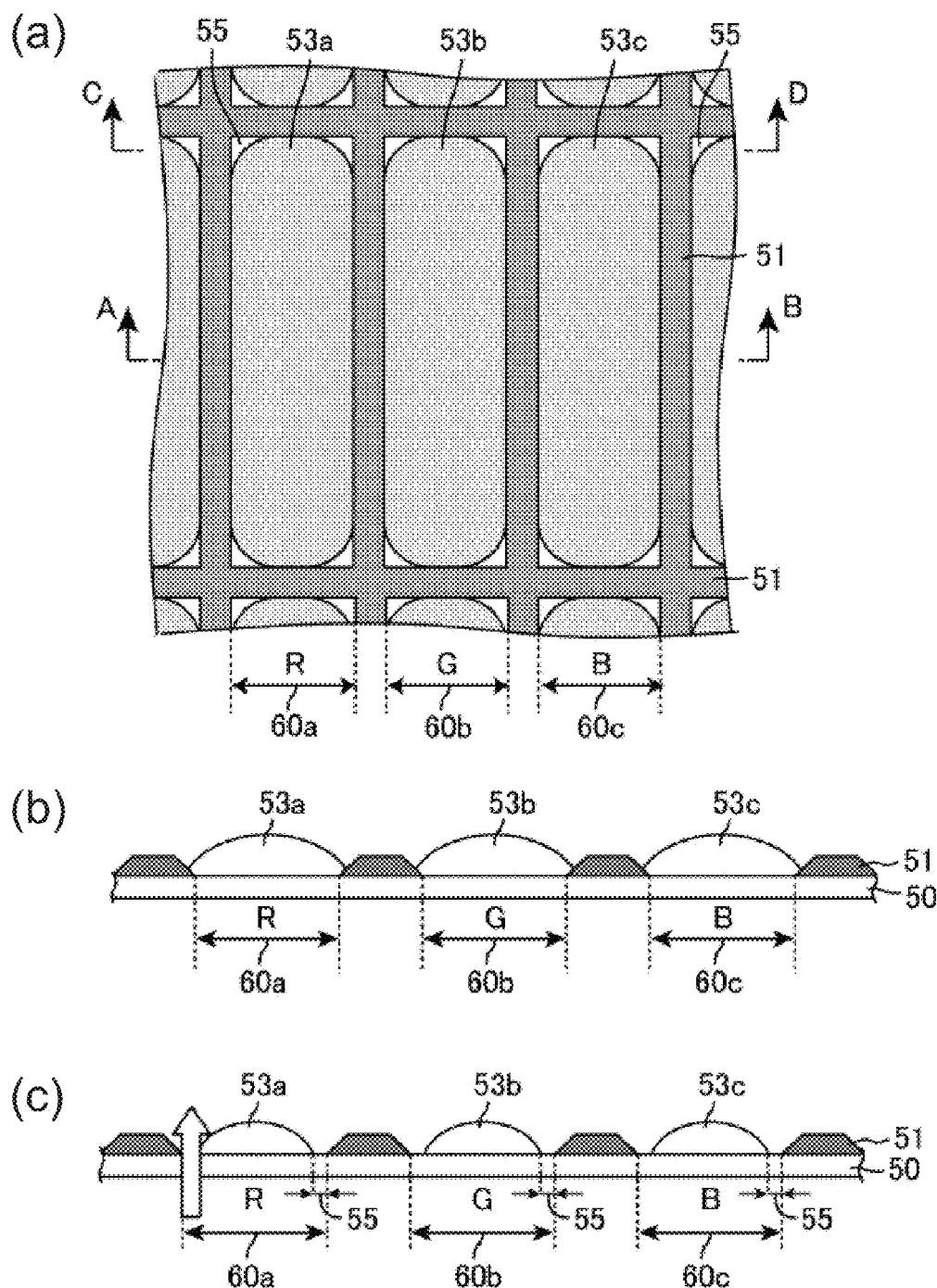
FIG. 7(a) is a schematic plan view showing an example of the configuration of a pixel of a conventional CF substrate.
FIG. 7(b) is a schematic cross-sectional view along the line A-B of the CF substrate of FIG. 7(a)
FIG. 7(c) is a schematic cross-sectional view along the line C-D of the CF substrate of FIG. 7(a).

With reference to FIG. 5, explanation of another embodiment will be made. This is an example in which a substrate for a display device is an organic EL substrate, a photosensitive, light-shielding resin is used as the resin material for forming the banks, and hole transport layers are formed by an inkjet method. The organic EL substrate here has a structure in which organic EL elements are formed on an active matrix substrate having top-gate type TFTs.

FIG. 5 is schematic cross-sectional view showing steps for manufacturing the organic EL substrate of the present embodiment. FIG. 5(a) shows a state where a resin film 62 for forming banks is formed over a principal surface of a glass substrate 60 on which TFTs 70, an interlayer insulating film 61, pixel electrodes (not shown in the figure), and the like are formed. In order to obtain a substrate in such a state, first, a plurality of the TFTs 70 is formed on the principal surface of the glass substrate 60 by a conventionally known method. Next, the interlayer insulating film 61, which has the function of a planarizing layer, is formed on the TFTs 70. As the interlayer insulating film 61, a film made of a lamination of a silicon nitride film and an acrylic resin layer can be used.

On the substrate on which the interlayer insulating film 61 was formed, pixel electrodes made of nickel (Ni) or the like are formed, and the resin film 62 is then formed so as to cover these pixel electrodes. Additionally, although not shown in the figures, the pixel electrodes are installed so as to connect with drain regions of the TFTs 70 through contact holes formed in the interlayer insulating film 61.

Next, as shown in FIG. 5(*b*), the first exposure step (S12) is performed in a manner similar to the above-mentioned Embodiment 1, and then, the development (pattern formation) step (S13) is performed in a manner similar to the above-mentioned Embodiment 1. As a result, as shown in FIG. 5(*c*), banks 63*a* with a desired pattern are formed on the interlayer insulating film 61. The banks 63*a* have a shape that surrounds the pixel electrodes in respective pixels so as to cover the edge of the pixel electrodes.

Next, in a manner similar to the above-mentioned Embodiment 1, the second exposure step (S14) is performed as shown in FIG. 5(*d*), and then, the resin material baking step (S15) is performed. As a result, banks 63*b* that have regions with high cure degree 64*a* and regions with low cure degree 64*b* are formed. However, the second exposure step (S14) is not a double-sided exposure, but a single-sided exposure from the upper surface side of the substrate.

Next, in a manner similar to the above-mentioned Embodiment 1, the lyophobic/lyophilic treatment step (S16) is performed. The condition of the fluorine plasma process can be set as appropriate, but the process condition similar to the one in the above-mentioned Embodiment 1 can be used, for example.

Next, as shown in FIG. 5(*e*), in a manner similar to the above-mentioned Embodiment 1, the coating step (S21) in which the liquid material is applied using the inkjet printing device 28 is performed. In this step, as the material for the hole transport layers, the water dispersions of polyethylenedioxythiophene (PEDOT)/polystyrene sulfonic acid (PSS) is applied to the pixel regions using the inkjet printing device 28 to form liquid layers 65. The liquid material forming the liquid layers 65 soaks into the regions with low cure degree 64*b* of the banks 63*b* to form the impregnated regions. Moreover, because the regions with high cure degree 64*a* in which the liquid material does not infiltrate are formed in the banks 63*b*, it is possible to prevent the water dispersions that have infiltrated in the banks 63*b* from mixing with the adjacent water dispersions. Furthermore, because a strong lyophobic characteristic has been added to the upper surface of the banks 63*b* in the lyophobic/lyophilic treatment step (S16), it is possible to prevent the water dispersions from going over the banks 63*b* to mix with the adjacent water dispersions.

Next, in a manner similar to the above-mentioned Embodiment 1, the liquid material baking step (S22) is performed. By this process, water, which is a disperse media, is dried and removed, and hole transport layers 66 as shown in FIG. 5(*f*) are formed. The banks 63*b* are also hardened. The banks 80 that underwent hardening have inclusion regions 75*a* that include the components of the hole transport solution and regions 75*b* that do not include the components of the hole transport solution. In the inclusion regions 75*a*, PEDOT/PSS of the hole transport solution is included, and water is not included because it has evaporated by baking. This can be verified by an elemental analysis using a Time-Of-Flight Secondary Ion Mass Spectrometry (TOF-SIMS), or the like, for example.

Light-emitting layers can also be formed by applying and drying a polyfluorene derivative solution by an inkjet method as in the case of the hole transport layers 66. Then, as a transparent cathode, aluminum (Al) including calcium (Ca) is deposited by resistive heat evaporation, and indium zinc oxide (IZO) is formed by a sputtering method, or the like. This completes a top-emission type organic EL substrate equipped with organic EL elements on the active matrix substrate.

In the present embodiment, it is possible to obtain an organic EL substrate in which across the adjacent pixel regions, the hole transport layers, and the light emitting layers do not mix with each other, respectively, and the hole transport layers and the light emitting layers are formed in the entire pixel regions. Accordingly, an organic EL device using this substrate has good display properties in which uneven brightness in the pixel regions is prevented.

Further, in the respective embodiments described above, the regions with low cure degree are formed in the banks in the second exposure step (S14) in order to form the impregnated regions of the ink material in the banks, but the present invention is not limited to this. For example, the regions with low cure degree can be formed in the banks also by using a mask with a mask pattern in which exposure amount can be adjusted in the first exposure step (S12). An example of the mask used in the first exposure step (S12) will be described using FIG. 3-2. FIG. 3-2(*a*) is a schematic plan view showing a configuration of the mask pattern, and FIGS. 3-2(*b*) and 3-2(*c*) are magnified schematic plan views of the region indicated with the dashed line A of FIG. 3-2(*a*).

In FIG. 3-2(*a*), light-shielding portions 122*a* and an opening 122*b* are formed in a mask 122, and as shown in FIG. 3-2(*b*), a slit region 123 in which a plurality of slits are formed is formed between the light-shielding portion 122*a* and the opening 122*b*. There is no special limitation for the number and width of the slits, but by making the width of slits narrower toward the opening 122*b* side from the light-shielding portion 122*a*, it is possible to easily lower the cure degree of the inner peripheral area of the banks that surrounds the pixel regions.

In FIG. 3-2(*c*), a semi-transmissive portion 124 is formed instead of the slit region 123. The semi-transmissive portion 124 has a lower density of the light-shielding material that forms the light-shielding portion 122*a*, and has a lower exposure amount than the opening 122*b*.

By using the mask 122, which includes the slit region 123 or the semi-transmissive portion 124 as described above, it is possible to easily adjust the exposure amount in the first exposure step (S12), and to form the impregnated region of the ink material without increasing the manufacturing steps, as compared to conventional methods for manufacturing banks.

Moreover, the above-mentioned description was made by introducing an example of using a glass substrate, but the present invention is not limited to this. For example, in the configuration of a top-emission type organic EL element, transparency is not required for the substrate because light is taken from the opposite side of the substrate, and therefore, a semiconductor substrate such as a silicon wafer can also be used.

Moreover, the above-mentioned description used an example of creating organic EL elements on the active matrix substrate, but the present invention can be implemented likewise when creating organic EL elements on a passive matrix substrate.

The present application claims priority of Japanese Patent Application 2008-332777 filed on Dec. 26, 2008, based on the regulations of Paris Convention or other laws of the countries that are entered. The entire content of that application is hereby incorporated by reference in the present application.

Description of Reference Characters 13a, 13b, 63a, 63b, 25, 51 banks
20, 50, 60 glass substrate
21 resin layer
22a opening
22 first mask
23 UV light
24a, 64a region with high cure degree
24b, 64b region with low cure degree
25b region not impregnated with the ink material
27 second mask
27a opening
28, 40 inkjet printing device
28a to 28c, 41a to 41c nozzles
30a to 30c droplets
31a to 31c, 53a to 53c ink layers
32a to 32c, 60a to 60c pixel regions
43a to 43c droplets
54 mixed regions
55 region with no ink applied
61 interlayer insulating film
62 resin film
65 liquid layer
66 hole transport layers
70 TFT
75a inclusion region
75b region not impregnated with the liquid material
122, 127 masks
122a light-shielding portion
122b openings
123 slit region
124 semi-transmissive portion
131a to 131c CF layers

The invention claimed is:

1. A substrate for a display device, comprising:
on a principal surface of a substrate, banks formed of a resin material, and color layers arranged in a plurality of pixel regions surrounded by said banks,
wherein said color layers are formed of a liquid material, and
wherein said bank includes a region having a lower cure degree than other regions of said bank so that the region having the lower cure degree is impregnated with said liquid material, the impregnated region in the bank being thereby soaked with the liquid material.

2. The substrate for a display device according to claim 1, wherein said bank does not have said impregnated region in a central area of said pixel regions that are adjacent to each other.

3. The substrate for a display device according to claim 1, wherein said bank includes said impregnated region in an area that is in contact with corners of said pixel regions.

4. The substrate for a display device according to claim 1, wherein said bank does not have said impregnated region in a central area between said pixel regions that are adjacent to each other, and includes said impregnated region in an area that is in contact with corners of said pixel regions.

5. The substrate for a display device according to claim 1, wherein said banks are formed of a light-shielding material in its entirety.

6. The substrate for a display device according to claim 1, wherein said color layers are formed of a colored transparent resin.

7. The substrate for a display device according to claim 1, wherein said color layers are electroluminescence layers.

8. A display device, comprising the substrate for a display device according to claim 1.

9. A method for manufacturing the substrate for a display device that includes on a principal surface of a substrate, banks formed of a resin material, and color layers formed of a liquid material arranged in a plurality of pixel regions surrounded by said banks, the method comprising:
a bank formation step in which said banks are formed; and
a color layer formation step in which said color layers are formed,
wherein said bank formation step comprises,
an exposure step in which exposure is performed on said resin material that has been formed into a pattern on the principal surface of said substrate, the exposure being performed such that in the resin material in an area that is in contact with said color layers, a region having a lower cure degree than that of the resin material of other areas is formed, and
wherein said color layer formation step comprises,
a coating step in which said liquid material is applied such that the region having the low cure degree formed in said exposure step becomes impregnated with the liquid material, the impregnated region being thereby soaked with the liquid material, and
a baking step in which said liquid material is baked and said color layers are formed, after said coating step.

10. The method for manufacturing the substrate for a display device according to claim 9, wherein said baking step includes performing polymerization of said resin material along with baking of said liquid material.

11. The method for manufacturing the substrate for a display device according to claim 9, wherein, in said exposure step, the exposure is performed on said resin material such that a cure degree of a central area between said pixel regions that are adjacent to each other becomes higher than a cure degree of a peripheral area.

12. The method for manufacturing the substrate for a display device according to claim 9, wherein, in said exposure step, the exposure is performed on said resin material such that a cure degree of a region in contact with corners of said pixel regions becomes lower than a cure degree of other regions.

* * * * *